United States Patent
Nerot et al.

(10) Patent No.: US 7,242,079 B2
(45) Date of Patent: Jul. 10, 2007

(54) METHOD OF MANUFACTURING A DATA CARRIER

(75) Inventors: Dorothée Nerot, Orleans (FR); Yves Reignoux, Clery Saint-André (FR)

(73) Assignee: Axalto S.A., Montrouge Cedex (FR)

( * ) Notice: Subject to any disclaimer, the term of this patent is extended or adjusted under 35 U.S.C. 154(b) by 0 days.

(21) Appl. No.: 10/531,365

(22) PCT Filed: Oct. 15, 2003

(86) PCT No.: PCT/IB03/04536

§ 371 (c)(1),
(2), (4) Date: Apr. 14, 2005

(87) PCT Pub. No.: WO2004/036648

PCT Pub. Date: Apr. 29, 2004

(65) Prior Publication Data

US 2006/0012023 A1 Jan. 19, 2006

(30) Foreign Application Priority Data

Oct. 15, 2002 (EP) .................................. 02292545
Feb. 11, 2003 (EP) .................................. 03290338

(51) Int. Cl.
*H01L 23/02* (2006.01)

(52) U.S. Cl. .................. 257/679; 257/668; 257/692; 257/730; 257/666; 257/676; 257/684; 257/690

(58) Field of Classification Search ................ 257/679, 257/668, 692, 730, 666, 676, 680, 694
See application file for complete search history.

(56) References Cited

U.S. PATENT DOCUMENTS

| | | | |
|---|---|---|---|
| 4,460,825 A | * | 7/1984 | Haghiri-Tehrani et al. .. 235/488 |
| 5,041,395 A | | 8/1991 | Steffen |
| 5,581,065 A | * | 12/1996 | Nishikawa et al. ......... 235/492 |
| 6,071,758 A | * | 6/2000 | Steffen ........................ 438/112 |
| 6,641,049 B2 | * | 11/2003 | Luu ............................ 235/492 |

FOREIGN PATENT DOCUMENTS

DE 199 43 092-A 1 3/2001

OTHER PUBLICATIONS

"GSM Technical Specification GSM 11.14 Version 5.7.0" European Telecommunication Standard, XX, XX, Apr. 1, 1998, p. COMPLETE66, XP002089350 the whole document.
International Search Report dated Apr. 19, 2004.

* cited by examiner

*Primary Examiner*—Sara Crane
*Assistant Examiner*—Junghwa Im
(74) *Attorney, Agent, or Firm*—Osha Liang LLP

(57) ABSTRACT

A method of manufacturing a data carrier from a support strip includes an overmoulding step, in which at least one support element of the support strip is overmoulded so as to obtain a data carrier body, and a microcircuit-connecting step, in which a microcircuit is electrically connected to the wiring pads of the data carrier body so as to obtain the data carrier.

10 Claims, 2 Drawing Sheets

METHOD OF MANUFACTURING A DATA CARRIER

FIELD OF THE INVENTION

The invention concerns a method of manufacturing a data carrier provided with a microcircuit. The data carrier can be, for example, a plug that can be inserted in a cellular phone, said data carrier identifying the cellular phone user for accessing the telecommunication network. The plug can be, for example, a GSM plug respecting the GSM 11.11 standard (2G plug) or the third generation project (3G plug). The GSM plug is also known as a Subscriber Identity Module card (SIM card). The invention also concerns a support strip comprising substantially parallel gripping areas.

BACKGROUND OF THE INVENTION

FIG. 1 illustrates a method of manufacturing a plug that can be used in a cellular phone. Such a plug comprises a card body and a module. A module comprises a microcircuit and protective resin. The module is generally manufactured independently of the card body and tested separately. If the test is satisfactory, the module is embedded in the card body of an ISO card. The card body is then pre-cut in the format of a GSM plug. In a second testing step, the microcircuit is then tested again. This second test can also be carried out after the embedding but before the cutting. An ISO card provided with a pre-cut outline in the format of the plug is thus obtained. Before use, the plug is separated from the ISO card by the end user. Thus the GSM plugs are manufactured in a discontinuous manner.

SUMMARY OF THE INVENTION

An object of the invention is to reduce the costs.

According to one aspect of the invention, a method of manufacturing a plurality of data carriers from a support strip, a data carrier comprising a data carrier body provided with a microcircuit, the support strip comprising a plurality of support elements, a support element comprising wiring pads, comprises the following steps:

an overmoulding step, in which the support elements of the support strip are overmoulded so as to obtain a plurality of data carrier bodies, a microcircuit-connecting step, in which microcircuits are electrically connected to the wiring pads of the data carrier bodies so as to obtain a plurality of data carriers.

The data carrier can be, for example, a GSM plug. Thanks to the invention, a GSM plug can be directly obtained without having to manufacture a pre-cut ISO card. Less plastic material is required. In addition only one testing step is needed and only one support strip is handled during the manufacturing. The invention thus allows reducing the costs.

According to another aspect, the invention is a support strip comprising at least one roughly parallel gripping area. The support strip comprises, in addition, at least one support element. A support element comprises conducting elements. A conducting element comprises a contact pad and a wiring pad. A support element is connected to a gripping area using a snap-off junction area.

DETAILED DESCRIPTION

Figure 1:
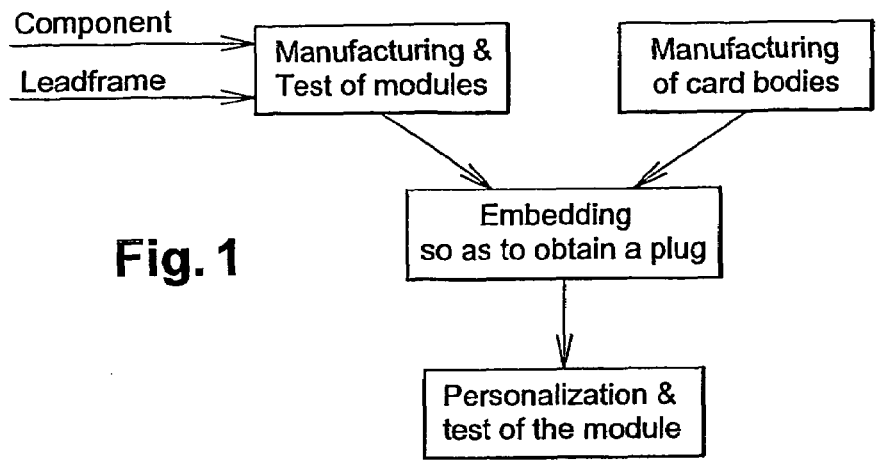
FIG. 1 is a diagram illustrating a known method of manufacturing a plug that can be used in a cellular phone.
Figure 2:
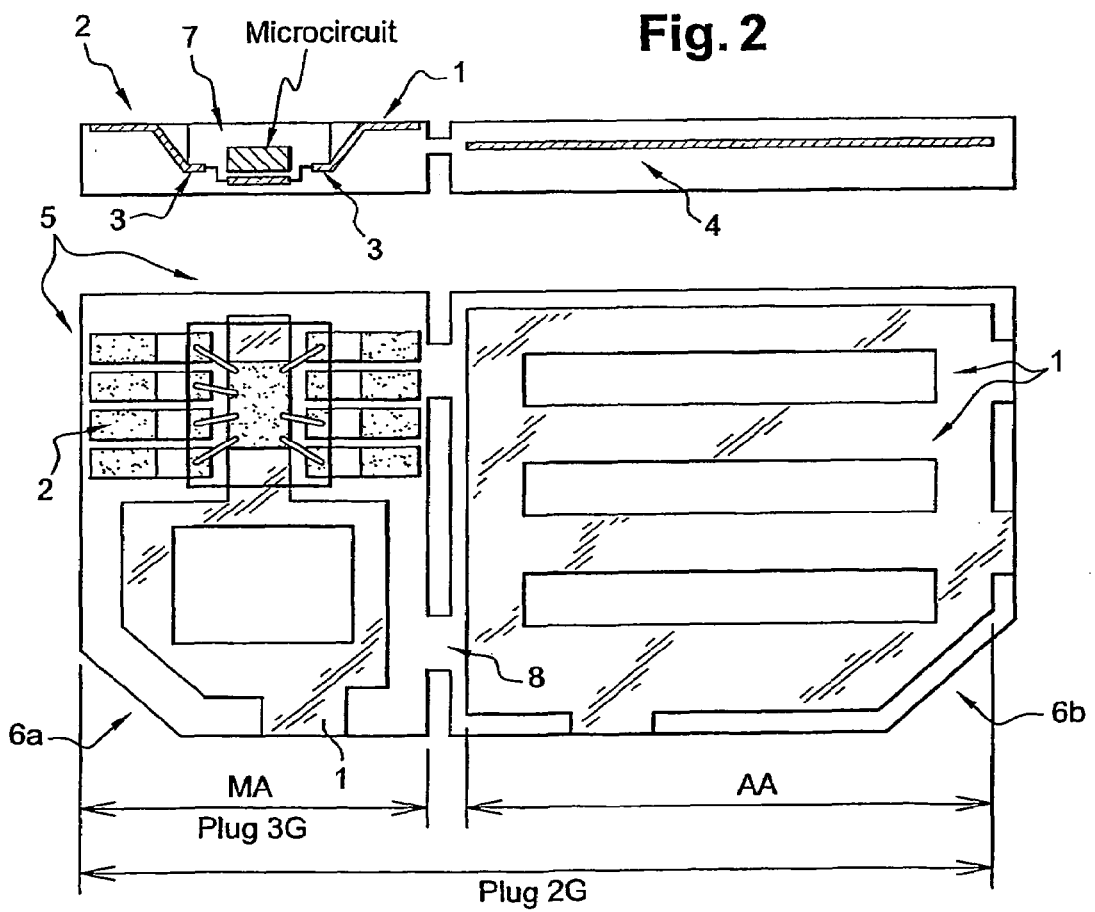
FIG. 2 shows a cross-section view and top view of a data carrier.

FIG. 2 illustrates a GSM plug comprising a card body provided with a microcircuit. The card body comprises a first side and a second side. A cut metal grid (1) is embedded in the card body. The cut metal grid comprises contact pads (2), wiring pads (3) and handling areas (indexing holes, support, etc.). The contact pads are flush with the first side. The card body is advantageously made of a thermoplastic (4) material. The GSM plug further comprises a support for the metal grid (1), reference edges (5) of the plug, 2G (6b) and 3G (6a) foolproofing areas and a cavity (7) arranged to receive the microcircuit and mark out the coating. The cavity (7) is advantageously placed on the first side so that the second side can easily be graphically personalized. Such a plug is described in the international patent application WO 0245010 which is hereby incorporated by reference.

Figure 3:
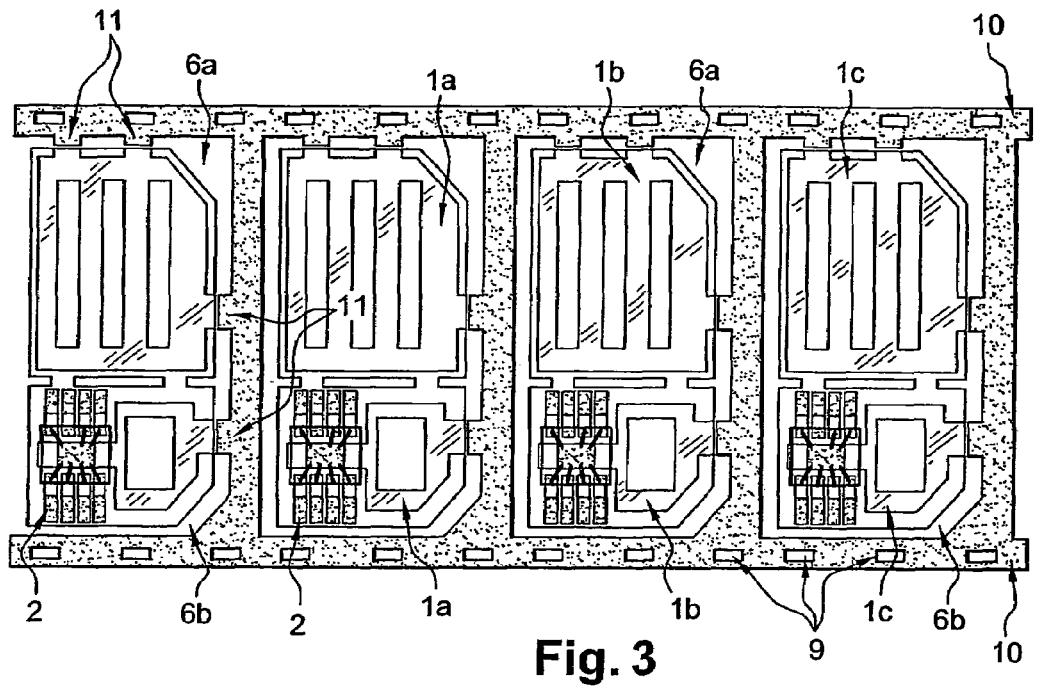
FIG. 3 illustrates a method of manufacturing a plurality of GSM plugs.

FIG. 3 illustrates a method of manufacturing a plurality of GSM plugs. The method consists of using a support strip. The support strip comprises indexing and foolproofing holes (9), gripping areas for support or clamping by handling systems (10) and snap-off junction areas (11). The support strip further comprises several metal grids (1a, 1b, 1c). A metal grid (1a) comprises contact pads (2), wiring pads (3), handling areas (indexing holes, support, etc.). The snap-off junction areas (11) are used to join a metal grid (1a) to the gripping areas (10) of the support strip.

In an overmoulding step, the various metal grids (1a, 1b, 1c) of the support strip are overmoulded, so as to obtain a plurality of card bodies. Overmoulding can be carried out using, for example, a thermoplastic material.

In a microcircuit-inserting step, microcircuits are inserted in the cavities (7) of the card bodies. The microcircuits are then electrically connected to the wiring pads (3) and coated with a protective resin so as to obtain GSM plugs. In a test and personalisation step, the card bodies are graphically personalised. The microcircuits are tested and personalised in this step. In a cutting step, the GSM plugs are cut to separate them from the rest of the support.

Thus the GSM plug are manufactured in a continuous manner.

The description hereinbefore illustrates a method of manufacturing a plurality of data carriers from a support strip, a data carrier comprising a data carrier body provided with a microcircuit, the support strip comprising a plurality of support elements (1), a support element comprising wiring pads, that comprises the following steps:

an overmoulding step, in which the support elements of the support strip are overmoulded so as to obtain a plurality of data carrier bodies; and a microcircuit-connecting step, in which microcircuits are electrically connected to the wiring pads (3) of the data carrier bodies so as to obtain a plurality of data carriers.

According to another aspect of the invention, the support strip comprises roughly parallel gripping areas (10). The support strip comprises a plurality of support elements (1). A support element comprises conducting elements. A conducting element comprises a contact pad and a wiring pad. The support element (1) is connected to a gripping area (10) using a snap-off junction area (11).

The data carrier element was a GSM plug. More generally, the data carrier element can be any data carrier comprising a body that can be moulded, for example, a plastic body.

The support elements are, for example, metal grids (1*a*, 1*b*, 1*c*). More generally, the support elements can be made from any material that is stiff enough to be overmoulded without being damaged.

The elements 9, 10 and 11 of the support strip can be made from metal or any other material stiff enough to allow good gripping. For example a plastic material could be used.

Alternatively, during the overmoulding step, various shapes can be obtained. Handling areas used for possible individual handling of a single data carrier can be overmoulded. The handling areas can be, for example, notches and/or holes used, for example, in alignment, orientation.

Figure 4:
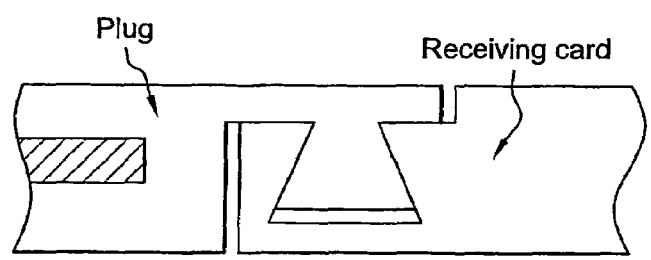
FIG. 4 illustrates a GSM plug arranged to be inserted in an ISO card.

As illustrated in FIG. 4, the metal grid can be overmoulded in such a manner that the thus obtained GSM plug can be inserted in a receiving card. In this respect, for example, a clipping element can be moulded in the GSM plug body.

As illustrated in FIG. 2, a 3G plug can also be directly integrated with the body of the 2G plug by adding a moulded snap-off area (8). The moulded snap-off area thus defines a main area (MA) and an auxiliary area (AA). Advantageously, the part of the metal grid corresponding to the auxiliary area (AA) can also be arranged to receive an electronic component such as, for example, a memory component, in particular a flash memory. The memory component can be connected to the microcircuit using, for example, a DSI bus. The electronic component can also be a crypto-processor or any other electronic component.

Advantageously, and preferably just before the microcircuit-inserting step, a printing step can be introduced, in which the various card bodies are printed.

What is claimed is:

1. A support strip comprising:
   at least one roughly parallel gripping area; and
   a first support element and at least a second support element,
   wherein the first support element comprises a first set of conducting elements, each of said conducting elements having a contact pad and a wiring pad,
   wherein the second support element comprises a second set of conducting elements, each of said conducting elements having a contact pad and a wiring pad, and
   wherein the first support element is connected to the at least one gripping area using at least a first snap-off junction area,
   wherein the second support element is connected to the at least one gripping area using at least a second snap-off junction area, and
   wherein each support element is configured to be overmoulded to obtain respectively a first and at least a second data carrier body.

2. The support strip according to claim 1, wherein the support element is a support grid.

3. The support strip according to claim 1, wherein the support element comprises a first set of foolproofing holes.

4. The support strip according to claim 3, wherein the support element comprises a second set of foolproofing holes.

5. The support strip according to claim 2, wherein the support grid is metallic.

6. The support strip according to claim 1, wherein the first support element has a contour whose geometry substantially complies with GSM 11.11.

7. The support strip according to claim 1, wherein the support element is arranged to receive an electronic component.

8. The support strip according to claim 7, wherein the electronic component is a microcircuit.

9. The support strip of according to claim 1, wherein the first support element is overmoulded using a thermoplastic.

10. The support strip according to claim 1, wherein a microcircuit is connected to at least one wiring pad in the first set of conducting elements after the first support element has been overmoulded.

* * * * *